(12) United States Patent
Sawabe et al.

(10) Patent No.: US 8,034,529 B2
(45) Date of Patent: Oct. 11, 2011

(54) PHOTOSENSITIVE RESIN COMPOSITION AND PHOTOSENSITIVE ELEMENT

(75) Inventors: Ken Sawabe, Hitachi (JP); Takeshi Nojiri, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 464 days.

(21) Appl. No.: 12/065,110

(22) PCT Filed: Jul. 19, 2006

(86) PCT No.: PCT/JP2006/314291
§ 371 (c)(1),
(2), (4) Date: May 4, 2009

(87) PCT Pub. No.: WO2007/026475
PCT Pub. Date: Mar. 8, 2007

(65) Prior Publication Data
US 2009/0214979 A1    Aug. 27, 2009

(30) Foreign Application Priority Data
Aug. 30, 2005 (JP) ................................ 2005-250086

(51) Int. Cl.
*G03F 7/023* (2006.01)
(52) U.S. Cl. .................... 430/192; 430/165; 430/193
(58) Field of Classification Search .................. 430/165, 430/192, 193
See application file for complete search history.

(56) References Cited

U.S. PATENT DOCUMENTS

| | | | |
|---|---|---|---|
| 4,564,575 A | 1/1986 | Perreault et al. | |
| 4,681,923 A | 7/1987 | Demmer et al. | |
| 5,208,138 A | 5/1993 | Lazarus et al. | |
| 6,641,972 B2 * | 11/2003 | Misumi et al. | 430/192 |
| 2003/0119957 A1 * | 6/2003 | Kim et al. | 524/317 |

FOREIGN PATENT DOCUMENTS

| | | |
|---|---|---|
| CN | 1536442 | 10/2004 |
| JP | 60-159847 | 8/1985 |
| JP | 61-218616 | 9/1986 |
| JP | 61-243869 | 10/1986 |
| JP | 03-253093 | 11/1991 |
| JP | 06-192387 | 7/1994 |
| JP | 07-041716 | 2/1995 |
| JP | 08-211601 | 8/1996 |
| JP | 09-136942 | 5/1997 |
| JP | 2001-114853 | 4/2004 |
| JP | 2005-221726 | 8/2005 |
| WO | WO 02/24774 A1 | 3/2002 |

OTHER PUBLICATIONS

Taiwanese Official Action issued on Oct. 23, 2009, for Application No. 095127314.
International Preliminary Report on Patentability (Translation) for Application No. PCT/JP2006/314291, dated Mar. 13, 2008.
Chinese Official Action issued on Jun. 30, 2010, for Application No. 200680031281.0.

* cited by examiner

*Primary Examiner* — John Chu
(74) *Attorney, Agent, or Firm* — Antonelli, Terry, Stout & Kraus, LLP.

(57) ABSTRACT

A photosensitive resin composition comprising (a) a compound obtained by reacting a polybasic acid anhydride with the phenolic hydroxyl groups of a novolac-type phenol resin, and (b) a 1,2-quinonediazide compound. The photosensitive resin composition, which comprises component (b) composed of a 1,2-quinonediazide compound in combination with a component (a) obtained by reacting a polybasic acid anhydride with the phenolic hydroxyl groups of a novolac-type phenol resin, exhibits sufficiently high photosensitivity, image contrast, resolution and adhesiveness.

5 Claims, 1 Drawing Sheet

Fig.1

PHOTOSENSITIVE RESIN COMPOSITION AND PHOTOSENSITIVE ELEMENT

TECHNICAL FIELD

The present invention relates to a photosensitive resin composition and to a photosensitive element.

BACKGROUND ART

Known methods for forming images used for patterning of semiconductor integrated circuits, liquid crystal display elements and printed circuit boards include methods that utilize positive photoresists comprising combinations of novolac-type phenol resins and 1,2-quinonediazide compounds.

Such a positive photoresist is alkali-insoluble at the unexposed sections and alkali-soluble at the exposed sections, so that the resist at the exposed sections is removed during alkali development. The 1,2-quinonediazide compound interacts with the novolac-type phenol resin at the unexposed sections during that time, acting as a dissolution preventer to render them alkali-insoluble. At the exposed sections, the 1,2-quinonediazide compound dissolves under the ultraviolet irradiation, undergoing Wolff rearrangement to produce an indene ketene. The indene ketene in addition reacts with water to produce an indenecarboxylic acid. This indenecarboxylic acid is acidic, while the residual novolac-type phenol resin is also weakly acidic because of its phenolic hydroxyl groups. The exposed sections are therefore rendered soluble in the strong alkaline aqueous solution of tetramethylammonium hydroxide.

However, development with strong alkaline aqueous solutions such as tetramethylammonium hydroxide can sometimes lead to peeling of the unexposed sections as well. When this occurs, the positive photoresist fails to exhibit adequate resolution. The use of strong alkaline aqueous solutions is also problematic from the viewpoint of safety and waste water treatment, as well as other environmental issues.

A demand therefore exists for a photosensitive resin composition that can be sufficiently developed even with weak alkaline aqueous solutions.

It has been attempted to meet this demand by enhancing the properties of photosensitive resin compositions. For example, there have been proposed photosensitive resin compositions containing compounds obtained by addition of acid anhydrides to reaction products of novolac-type epoxy compounds and unsaturated monobasic acids (see Patent documents 1-5). There have also been disclosed thermosetting/photocuring compositions containing a carboxyl group-containing, obtained by reacting an unsaturated monobasic acid with the reaction product of a novolac-type phenol resin and an alkylene oxide and reacting an acid anhydride with the resulting reaction product (see Patent document 6). Also proposed have been positive photosensitive resin compositions employing novolac-type phenol resins obtained by reaction between an acid anhydride and the alcoholic hydroxyl group of an alcoholic hydroxy group-containing novolac-type phenol resin (see Patent document 7).

[Patent document 1] Japanese Unexamined Patent Publication SHO No. 61-243869
[Patent document 2] Japanese Unexamined Patent Publication HEI No. 3-253093
[Patent document 3] Japanese Unexamined Patent Publication HEI No. 6-192387
[Patent document 4] Japanese Unexamined Patent Publication HEI No. 7-41716
[Patent document 5] Japanese Unexamined Patent Publication HEI No. 9-136942
[Patent document 6] International Patent Publication No. WO02/024774
[Patent document 7] Japanese Unexamined Patent Publication No. 2001-114853

DISCLOSURE OF THE INVENTION

Problems to be Solved by the Invention

The present inventors have carefully studied the conventional photosensitive resin compositions including the photosensitive resin compositions described in Patent documents 1-7 mentioned above. As a result, we have found that with conventional photosensitive resin compositions, it is difficult to satisfactorily obtain all of the desired properties including sufficiently high photosensitivity, image contrast, resolution and adhesiveness.

That is, because the photosensitive resin compositions described in Patent documents 1-5 employ novolac-type epoxy resins, the alkali resistance and the adhesiveness between the substrate and resist tend to be inferior than when using novolac-type phenol resins.

The photosensitive resin composition described in Patent document 6, while employing a novolac-type phenol resin, does not utilize a 1,2-quinonediazide compound. The photosensitive resin composition therefore does not function as a positive photoresist. The novolac-type phenol resin described in Patent document 6 also contains no phenolic hydroxyl groups. As a result, even if the photosensitive resin composition contains a quinonediazide compound, the interaction between the novolac-type phenol resin and quinonediazide compound is insufficient such that the unexposed sections tend to have insufficient alkali insolubility. The photosensitive resin composition of Patent document 6 thus tends to produce unsatisfactory image contrast.

The photosensitive resin composition described in Patent document 7 employs both a novolac-type phenol resin and a 1,2-quinonediazide compound. However, synthesis of the novolac-type phenol resin is somewhat complicated for mass productivity.

It is an object of the present invention, which has been accomplished in light of the aforementioned problems of the prior art, to provide a photosensitive resin composition and photosensitive element that can be sufficiently developed even with weak alkaline aqueous solutions, and that exhibit sufficiently high photosensitivity, image contrast, resolution and adhesiveness.

Means for Solving the Problems

The invention solves the problems by providing a photosensitive resin composition comprising (a) a compound obtained by reacting a polybasic acid anhydride with the phenolic hydroxyl groups of a novolac-type phenol resin, and (b) a 1,2-quinonediazide compound.

The photosensitive resin composition comprises a component (b) composed of a 1,2-quinonediazide compound, together with a component (a) obtained by reacting a polybasic acid anhydride with the phenolic hydroxyl groups of a novolac-type phenol resin. The photosensitive resin composition thereby exhibits sufficiently high photosensitivity, image contrast, resolution and adhesiveness.

When the photosensitive resin composition is used in a resist film, the acidity of component (a) at the exposed sections allows dissolution of the exposed sections in the developing solution even if the developing solution is weakly alkaline. It is therefore easier to dissolve the exposed sections in weak alkaline aqueous solutions during alkali development to release the resist. At the unexposed sections, the 1,2-quinonediazide compound interacts strongly with the phenolic hydroxyl groups of component (a) that have not reacted with the polybasic acid anhydride, thus rendering these sections alkali-insoluble.

According to the invention, therefore, it is possible to produce a photosensitive resin composition that develops in a satisfactory manner even with weak alkaline aqueous solutions, and that exhibits sufficiently high photosensitivity, image contrast, resolution and adhesiveness.

Component (a) mentioned above preferably has in the molecule at least one divalent group represented by the following general formula (A). This will allow more satisfactory development even with weak alkaline aqueous solutions.

[Chemical Formula 1]

(A)

In formula (A), R represents a carboxylic anhydride residue.

Component (b) is preferably a compound obtained by reacting an organic compound with a hydroxyl and/or amino group and a 1,2-quinonediazide compound with a sulfo group and/or sulfonyl chloride group. This will provide an advantage of more excellent photosensitivity of the photosensitive resin composition.

The organic compound with a hydroxyl and/or amino group is preferably a compound represented by any one of the following general formulas (1)-(3). This will provide an advantage of even more excellent image contrast of the photosensitive resin composition, since the difference in solubility of the photosensitive resin composition in the developing solution before and after irradiation will be increased.

[Chemical Formula 2]

(1)

[Chemical Formula 3]

(2)

[Chemical Formula 4]

(3)

In formulas (1)-(3), $R^1$, $R^2$, $R^3$, $R^4$, $R^5$, $R^6$, $R^7$, $R^8$, $R^9$, $R^{10}$, $R^{11}$ and $R^{12}$ each independently represent hydrogen atom, substituted or unsubstituted C1-5 alkyl group or substituted or unsubstituted C1-5 alkoxy group, and X represents a single bond, oxygen atom or phenylene group.

The acid value of component (a) in the photosensitive resin composition is preferably 30-150 mgKOH/g. This will give the photosensitive resin composition a more excellent balance between the alkali resistance and developing property.

In the photosensitive resin composition described above, the mixing proportion of component (a) is preferably 50-95 parts by mass and the mixing proportion of component (b) is preferably 5-50 parts by mass with respect to 100 parts by mass as the total of components (a) and (b). This will provide an advantage of more excellent coating property of the photosensitive resin composition.

The invention further provides a photosensitive element comprising a support and a photosensitive layer composed of a photosensitive resin composition according to any one of claims 1 to 3 formed on the support.

Since the photosensitive element comprises a photosensitive layer made of a photosensitive resin composition of the invention exhibiting the effect described above, it has very satisfactory weak alkali developing properties. In addition, the photosensitive element also exhibits sufficiently high photosensitivity, image contrast, resolution and adhesiveness. Resist patterns can therefore be formed with adequate resolution. The photosensitive element can be suitably used for manufacture of semiconductor integrated circuits, liquid crystal display elements and printed circuit boards that have excellent photosensitivity, image contrast, resolution and adhesiveness.

Effect of the Invention

According to the invention, it is possible to produce a photosensitive resin composition and photosensitive element that can be sufficiently developed even with weak alkaline aqueous solutions, and that exhibit sufficiently high photosensitivity, image contrast, resolution and adhesiveness.

EXPLANATION OF SYMBOLS

1: Photosensitive element, 10: support, 14: photosensitive layer.

BEST MODE FOR CARRYING OUT THE INVENTION

Preferred embodiments of the invention will now be explained in detail, with reference to the accompanying drawings as necessary. Identical elements in the drawings will be referred to by like reference numerals and will be explained only once. The vertical and horizontal positional relationships are based on the positional relationships in the drawings, unless otherwise specified. Also, the dimensional proportions depicted in the drawings are not necessarily limitative.

The photosensitive resin composition of the invention comprises (a) a compound obtained by reacting a polybasic acid anhydride with the phenolic hydroxyl groups of a novolac-type phenol resin, and (b) a 1,2-quinonediazide compound.

The photosensitive resin composition of the invention comprises a component (b) composed of a 1,2-quinonediazide compound, together with component (a) obtained by reacting a polybasic acid anhydride with the phenolic hydroxyl groups of a novolac-type phenol resin. It is thereby possible to achieve satisfactory development of photosensitive layers made of the photosensitive resin composition even when the developing solution is a weak alkaline aqueous solution. The photosensitive resin composition of the invention exhibits sufficiently high photosensitivity, image contrast, resolution and adhesiveness.

Components (a) and (b) will be explained in detail below.

(Component (a))

Component (a) is a compound obtained by reacting a polybasic acid anhydride with the phenolic hydroxyl groups of a novolac-type phenol resin.

Component (a) preferably has in the molecule at least one divalent group represented by general formula (A) above. This will allow more satisfactory development even with weak alkaline aqueous solutions.

The novolac-type phenol resin will now be discussed in more detail. The novolac-type phenol resin of the invention is not particularly restricted so long as it possesses phenolic hydroxyl groups. The novolac-type phenol resin may be obtained, for example, by condensation polymerization using a phenol compound and an aldehyde and/or ketone as starting materials.

As examples of phenol compounds there may be mentioned phenol, cresol and xylenol; alkylphenols such as ethylphenol, butylphenol and trimethylphenol; alkoxyphenols such as methoxyphenol and 2-methoxy-4-methylphenol; alkenylphenols such as vinylphenol and allylphenol; arylphenols such as phenylphenol; aralkylphenols such as benzylphenol; alkoxycarbonylphenols such as methoxycarbonylphenol; arylcarbonylphenols such as benzoyloxyphenol; halogenated phenols such as chlorophenol; polyhydroxybenzenes such as catechol and resorcinol; bisphenols such as bisphenol A and bisphenol F; naphthol compounds such as α- or β-naphthol; methylol compounds such as bishydroxymethyl-p-cresol; hydroxyalkylphenols such as p-hydroxyphenyl-2-ethanol, p-hydroxyphenyl-3-propanol and p-hydroxyphenyl-4-butanol; hydroxyalkylcresols such as hydroxyethylcresol; alcoholic hydroxyl-containing phenol compounds such as monoethylene oxide addition products of bisphenol and monopropylene oxide addition products of bisphenol; and carboxyl group-containing phenol compounds such as p-hydroxyphenylacetic acid, p-hydroxyphenylpropionic acid, p-hydroxyphenylbutanoic acid, p-hydroxycinnamic acid, hydroxybenzoic acid, hydroxyphenylbenzoic acid, hydroxyphenoxybenzoic acid and diphenolic acid. These phenol compounds may also be subjected to condensation polymerization with compounds other than phenols such as m-xylene. They may be used alone or in combinations of two or more.

As examples of aldehydes and/or ketones there may be mentioned formaldehyde, acetaldehyde, furfural, benzaldehyde, hydroxybenzaldehyde, methoxybenzaldehyde, hydroxyphenylacetaldehyde, methoxyphenylacetaldehyde, crotonaldehyde, chloroacetaldehyde, chlorophenylacetaldehyde, acetone, glyceraldehyde, glyoxylic acid, methyl glyoxylate, phenyl glyoxylate, hydroxyphenyl glyoxylate, formylacetic acid, formylmethyl acetate, 2-formylpropionic acid, 2-formylmethyl propionate, pyruvic acid, levulinic acid, 4-acetylbutyric acid, acetonedicarboxylic acid and 3,3',4,4'-benzophenonetetracarboxylic acid. Formaldehyde may be used in the form of one of its precursors such as p-formaldehyde or trioxane. These compounds may be used alone or in combinations of two or more.

An acidic catalyst is preferably used for the condensation polymerization reaction, because its use can accelerate the condensation polymerization reaction. As acidic catalysts there may be mentioned hydrochloric acid, sulfuric acid, formic acid, acetic acid, p-toluenesulfonic acid, oxalic acid and the like.

The aldehyde and/or ketone content in the starting material is preferably 0.7-1 mol to 1 mol of the phenol compound. This will help accelerate the condensation polymerization reaction.

The polybasic acid anhydride will now be explained. The polybasic acid anhydride of the invention is not particularly restricted so long as it has a structure derived from more than one carboxylic acid and its structure is in the dehydrated/condensed (acid anhydride) form of the carboxylic acids. As examples of polybasic acid anhydrides there may be mentioned dibasic acid anhydrides such as phthalic anhydride, succinic anhydride, octenylsuccinic anhydride, pentadodecenylsuccinic anhydride, maleic anhydride, itaconic anhydride, tetrahydrophthalic anhydride, hexahydrophthalic anhydride, methyltetrahydrophthalic anhydride, methylhexahydrophthalic anhydride, nadic anhydride, 3,6-endomethylenetetrahydrophthalic anhydride, methylendomethylenetetrahydrophthalic anhydride, tetrabromophthalic anhydride and trimellitic anhydride, or aliphatic or aromatic tetrabasic acid dianhydrides such as biphenyltetracarboxylic dianhydride, naphthalenetetracarboxylic dianhydride, diphenylethertetracarboxylic dianhydride, butanetetracarboxylic dianhydride, cyclopentanetetracarboxylic dianhydride, pyromellitic anhydride and benzophenonetetracarboxylic dianhydride. These may be used as single types or as combinations of two or more types.

Dibasic acid anhydrides are preferred among the above, and more preferred are one or more selected from the group consisting of tetrahydrophthalic anhydride, succinic anhydride and hexahydrophthalic anhydride, for example. These have the advantage of providing a more excellent patterning property, which is the ability to form a resist pattern.

The reaction between the novolac-type phenol resin and the polybasic acid anhydride is preferably carried out at 50-130° C., and the polybasic acid anhydride is reacted at preferably 0.10-0.80 mol, more preferably 0.15-0.60 mol and even more preferably 0.20-0.40 mol with respect to 1 mol of phenolic hydroxyl groups in the novolac-type phenol resin. If the amount of polybasic acid anhydride reacted is less than 0.10 mol, the developing property will tend to be poor compared to when it is within the range specified above, while if the amount of polybasic acid anhydride reacted is greater than 0.80 mol, the alkali resistance of the unexposed sections will tend to be poor compared to when it is within the range specified above.

A catalyst may also be added if necessary for the reaction. Its addition can further accelerate the reaction. As such catalysts there may be mentioned tertiary amines such as triethylamine, quaternary ammonium salts such as triethylbenzylammonium chloride, imidazole compounds such as 2-ethyl-4-methylimidazole and phosphorus compounds such as triphenylphosphine.

The condensation polymerization may be carried out under known reaction conditions.

The acid value of the novolac-type phenol resin obtained in the manner described above is preferably 30-150 mgKOH/g, more preferably 40-140 mgKOH/g and even more preferably 50-120 mgKOH/g. An acid value of less than 30 mgKOH/g will tend to necessitate a longer time for alkali development compared to an acid value in the range specified above. An acid value above 150 mgKOH/g, on the other hand, will tend to lower the developing solution resistance of the resist at the unexposed sections, compared to an acid value in the range specified above.

The weight-average molecular weight of the novolac-type phenol resin in terms of polystyrene as determined by gel permeation chromatography is not particularly restricted but is preferably 300-100,000, more preferably 1000-50,000 and even more preferably 3000-20,000. This range will provide an advantage of more excellent coated film properties.

When the novolac-type phenol resin has a low weight-average molecular weight, a chain extender may be used for multimerization of the phenol resin to increase the weight-average molecular weight to within the range specified above. As the chain extender there may be used a diepoxy compound or dioxazoline compound capable of reacting with carboxyl groups or a diisocyanate compound capable of reacting with hydroxyl groups.

The degree of dispersion of the novolac-type phenol resin is preferably 1-10. This range will provide an advantage of more excellent coated film properties. The degree of dispersion referred to here is the weight-average molecular weight divided by the number-average molecular weight.

According to the invention, the novolac-type phenol resin used may be of a single type or it may be a combination of two or more types. As examples of combinations of novolac-type phenol resins when two or more different ones are used, there may be mentioned two or more novolac-type phenol resins composed of different starting materials, two or more novolac-type phenol resins with different weight-average molecular weights, and two or more novolac-type phenol resins with different degrees of dispersion.

The mixing proportion of component (a) in the photosensitive resin composition is preferably 50-95 parts by mass, more preferably 55-90 parts by mass and most preferably 60-85 parts by mass with respect to 100 parts by mass of the total of components (a) and (b). If the mixing proportion is less than 50 parts by mass, the resist film will tend to be brittle and peel off more easily when the photosensitive resin composition is used as a resist film, compared to when the mixing proportion is within the range specified above. If the mixing proportion is greater than 95 parts by mass, the photosensitivity of the resist film will tend to be less adequate than when the mixing proportion is within the range specified above.

(Component (b))

Component (b) is a 1,2-quinonediazide compound. The 1,2-quinonediazide compound is a compound obtained by reacting a 1,2-quinonediazide compound having a sulfo and/or sulfonyl chloride group, with an organic compound having a hydroxyl or amino group (hereinafter referred to simply as "organic compound"). This results in bonding of the hydroxyl or amino group of the organic compound to the sulfo or sulfonyl chloride group of the 1,2-quinonediazide compound. It is sufficient if at least one such bond exists in the molecule of the obtained 1,2-quinonediazide compound.

As 1,2-quinonediazide compounds with sulfo and/or sulfonyl chloride groups there may be mentioned 1,2-naphthoquinone-2-diazide-4-sulfonic acid, 1,2-naphthoquinone-2-diazide-5-sulfonic acid, ortho-anthraquinonediazidesulfonic acid, 1,2-naphthoquinone-2-diazide-4-sulfonyl chloride, 1,2-naphthoquinone-2-diazide-5-sulfonyl chloride and ortho-anthraquinonediazidesulfonyl chloride. Preferred among these are 1,2-naphthoquinone-2-diazide-4-sulfonic acid, 1,2-naphthoquinone-2-diazide-5-sulfonic acid, 1,2-naphthoquinone-2-diazide-4-sulfonyl chloride and 1,2-naphthoquinone-2-diazide-5-sulfonyl chloride. Since 1,2-quinonediazide compounds with sulfo and/or sulfonyl chloride groups dissolve well in solvents, it is possible to increase the reaction efficiency with the organic compound.

As organic compounds there may be mentioned polyhydroxybenzophenones such as 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5', -hexahydroxybenzophenone and 2,3,3',4,4',5'-hexahydroxybenzophenone; bis[(poly)hydroxyphenyl]alkanes such as bis(2,4-dihydroxyphenyl)methane, bis(2,3,4-trihydroxyphenyl)methane, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-[2-(4-hydroxyphenyl)-2-propyl]phenyl]ethylidene}bisphenol and 3,3'-dimethyl-{1-[4-[2-(3-methyl-4-hydroxyphenyl)-2-propyl]phenyl]ethylidene}bisphenol; tris(hydroxyphenyl)methanes or their methyl-substituted forms such as tris(4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-2,5-dimethylphenyl)-3,4-dihydroxyphenylmethane and bis(4-hydroxy-3,5-dimethylphenyl)-3,4-dihydroxyphenylmethane; bis(cyclohexylhydroxyphenyl)(hydroxyphenyl)methanes or their methyl-substituted forms such as bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis(3-cyclohexyl-2-hydroxyphenyl)-3-hydroxyphenylmethane, bis(5-cyclohexyl-4-hydroxy-3-methylphenyl)-4-hydroxyphenylmethane, bis(5-cyclohexyl-4-hydroxy-3-methylphenyl)-3-hydroxyphenylmethane, bis(5-cyclohexyl-4-hydroxy-3-methylphenyl)-2-hydroxyphenylmethane, bis(3-cyclohexyl-2-hydroxyphenyl)-4-hydroxyphenylmethane, bis(3-cyclohexyl-2-hydroxyphenyl)-2-hydroxyphenylmethane, bis(5-cyclohexyl-2-hydroxy-4-methylphenyl)-2-hydroxyphenylmethane and bis(5-cyclohexyl-2-hydroxy-4- methylphenyl)-4-hydroxyphenylmethane; and phenol, p-methoxyphenol, dimethylphenol, hydroquinone, naphthol, pyrocatechol, pyrogallol, pyrogallolmonomethyl ether, pyrogallol-1,3-dimethyl ether, gallic acid, aniline, p-aminodiphenylamine, 4,4'-diaminobenzophenone, novolac, pyrogallolacetone resin or p-hydroxystyrene either as homopolymers or as copolymers thereof with monomers that can copolymerize therewith. Preferred among the above are polyhydroxybenzophenones, bis[(poly)hydroxyphenyl]alkanes, tris(hydroxyphenyl)methanes and bis(cyclohexylhydroxyphenyl)(hydroxyphenyl)methanes.

The organic compound is more preferably a compound represented by any of general formulas (1)-(3) above. This will provide an advantage of even more excellent image contrast, since the difference in solubility in the developing solution before and after irradiation will be increased.

When the organic compound is a compound represented by any of general formulas (1)-(3) above, the 1,2-quinonediazide compound with a sulfo and/or sulfonyl chloride group is preferably 1,2-naphthoquinone-2-diazide-4-sulfonic acid, 1,2-naphthoquinone-2-diazide-5-sulfonic acid, 1,2-naphthoquinone-2-diazide-4-sulfonyl chloride or 1,2-naphthoquinone-2-diazide-5-sulfonyl chloride. These 1,2-quinonediazide compounds with sulfo and/or sulfonyl chloride groups have satisfactory compatibility with compounds represented by general formulas (1)-(3), so that the amount of cohesive particles generated by mixing components (a) and (b) can be reduced. Even greater sensitivity, image contrast and heat resistance can be exhibited by using a photosensitive resin composition containing these components as the photosensitive component of a positive photoresist.

Among the compounds represented by general formulas (1)-(3), more preferred organic compounds are those represented by the following chemical formulas (4)-(6). Such compounds will provide an advantage of even more excellent photosensitivity.

[Chemical Formula 5]

(4)

[Chemical Formula 6]

(5)

[Chemical Formula 7]

(6)

As an example of a method of synthesizing the 1,2-quinonediazide compound using a compound represented by any of chemical formulas (4)-(6), there may be mentioned a method in which the compound represented by any of chemical formulas (4)-(6) and 1,2-naphthoquinone-2-diazide-sulfonyl chloride are added to a solvent such as dioxane or THF and reacted in the presence of an alkali catalyst such as triethylamine, triethanolamine, an alkali carbonate or an alkali hydrogencarbonate. This results in synthesis of a 1,2-quinonediazide compound wherein the hydroxyl groups of the compound represented by chemical formulas (4)-(6) and the sulfonyl groups of the 1,2-naphthoquinone-2-diazide-sulfonyl chloride have been condensed. It is sufficient if the obtained 1,2-quinonediazide compound has in the molecule at least one bond between a hydroxyl of a compound represented by chemical formulas (4)-(6) and a sulfonyl group of 1,2-naphthoquinone-2-diazide-sulfonyl chloride.

Preferred as the 1,2-naphthoquinone-2-diazide-sulfonyl chloride is 1,2-naphthoquinone-2-diazide-4-sulfonyl chloride or 1,2-naphthoquinone-2-diazide-5-sulfonyl chloride.

One type of 1,2-quinonediazide compound with a sulfo and/or sulfonyl chloride group may be used alone, or two or more different types may be used together.

The mixing proportion of component (b) in the photosensitive resin composition is preferably 5-50 parts by mass, more preferably 10-45 parts by mass and most preferably 15-40 parts by mass with respect to 100 parts by mass of the total of components (a) and (b). If the mixing proportion is less than 5 parts by mass, the photosensitivity will tend to be less adequate than when the mixing proportion is within the range specified above. If the mixing proportion of component (b) is greater than 50 parts by mass, the resist film will tend to be brittle and peel off more easily when the photosensitive resin composition is used as a resist film, compared to when the mixing proportion is within the range specified above.

(Other Components)

The photosensitive resin composition of the invention may also contain a phenol resin without carboxyl groups in addition to component (a) described above. This range will provide an advantage of more excellent alkali resistance. Any publicly known phenol resins with carboxyl groups may be used, including novolac-type phenol resins, resol-type phenol resins and bisphenol resins; polyphenol compounds obtained by addition reaction of phenol compounds with diolefin compounds such as divinylbenzene and dicyclopentadiene; polyphenol compounds obtained by reaction of phenol compounds with aralkyl halides, aralkyl alcohols or their derivatives; and triazinephenol-novolac resins or the like. These may be used as single types or as combinations of two or more types.

The photosensitive resin composition of the invention may also contain a surfactant if necessary, for the purpose of enhancing the coating property, antifoaming property and leveling property. There are no particular restrictions on the surfactant, but fluorine-based surfactants are preferred. As examples of such fluorine-based surfactants there may be mentioned the commercial products BM-1000 and BM-1100 (BM Chemie); MEGAFAC F 142D, MEGAFAC F 172, MEGAFAC F173, MEGAFAC F183, MEGAFAC R-08, MEGAFAC R-30, MEGAFAC R-90PM-20 and MEGAFAC BL-20 (Dainippon Ink and Chemicals, Inc.); FLUORAD FC-135, FLUORAD FC-170C, FLUORAD FC-430, FLUO- RAD FC-431 and FLUORAD FC-4430 (Sumitomo 3M); SURFLON S-112, SURFLON S-113, SURFLON S-131, SURFLON S-141 and SURFLON S-145 (Asahi Glass Co., Ltd.) and SH-28PA, SH-190, SH-193, SZ-6032 and SF-8428 (Toray Silicone Co., Ltd.). These may be used either alone or as combinations of two or more.

The mixing proportion of the surfactant is preferably no greater than 5 parts by mass with respect to 100 parts by mass as the total of component (a) and component (b). If the mixing proportion is greater than 5 parts by mass, the image contrast will tend to be lower than when the mixing proportion is within the range specified above.

The photosensitive resin composition of the invention may also contain an adhesion aid to enhance adhesion with substrates and the like. Effective adhesion aids include functional silane coupling agents. A functional silane coupling agent is a silane coupling agent having a reactive substituent such as carboxyl, methacryloyl, isocyanate or epoxy. As examples of functional silane coupling agents there may be mentioned trimethoxysilylbenzoic acid, γ-methacryloxypropyltrimethoxysilane, vinyltriacetoxysilane, vinyltrimethoxysilane, γ-glycidoxypropyltrimethoxysilane, β-(3,4-epoxycyclohexyl)ethyltrimethoxysilane, trimethoxysilylpropyl isocyanate and 1,3,5-N-tris(trimethoxysilylpropyl)isocyanate. These may be used alone or as combinations of two or more types.

The mixing proportion of an adhesion aid is preferably no greater than 20 parts by mass with respect to 100 parts by mass as the total of component (a) and component (b). If the mixing proportion is greater than 20 parts by mass, more development residue will tend to be produced than when the mixing proportion is within the range specified above.

The photosensitive resin composition of the invention may still further contain an acid or a high boiling point solvent for fine adjustment of the solubility in the alkali development solution. As acids there may be mentioned monocarboxylic acids such as acetic acid, propionic acid, n-butyric acid, isobutyric acid, n-valeric acid, iso-valeric acid, benzoic acid and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid and syringic acid; polyhydric carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentanetetracarboxylic acid, butanetetracarboxylic acid, 1,2,5,8-naphthalenetetracarboxylic acid; and acid anhydrides such as itaconic anhydride, succinic anhydride, citraconic anhydride, dodecenylsuccinic anhydride, tricarbanilic anhydride, maleic anhydride, hexahydrophthalic anhydride, anhydrous methyltetrahydrophthalic acid, hymic anhydride, 1,2,3,4-butanetetracarboxylic acid, cyclopentanetetracarboxylic dianhydride, phthalic anhydride, pyromellitic anhydride, trimellitic anhydride, anhydrous benzophenonetetracarboxylic acid, ethylene glycol bis(trimellitic) anhydride and glycerin tris(trimellitate anhydride).

As high boiling point solvents there may be mentioned N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl malate, γ-butyrolactone, ethylene carbonate, propylene carbonate, phenylcellosolve acetate and the like. These may be used alone or as combinations of two or more types.

The mixing proportion of such acids or high boiling point solvents may be adjusted according to the purpose of use and the method of application, and is not particularly restricted so long as such components can be homogeneously mixed with the photosensitive resin composition. However, the mixing proportion is preferably no greater than 60% by mass and even more preferably no greater than 40% by mass with respect to the total photosensitive resin composition. This is desired to prevent impairing the properties of the photosensitive resin composition.

If necessary, the photosensitive resin composition of the invention may also contain additives such as sensitizing agents, light absorbers (dyes), crosslinking agents, plasticizers, pigments, fillers, flame retardants, stabilizers, tackifiers, release promoters, antioxidants, aromatics, imaging agents, thermal crosslinking agents and the like. These additives may be used alone or as combinations of two or more types.

The mixing proportions of such additives are not particularly restricted so long as the properties of the photosensitive resin composition are not impaired, but they are preferably no greater than 50% by mass with respect to the total photosensitive resin composition.

The photosensitive resin composition of the invention may be prepared with mixing and stirring by ordinary methods, and addition of fillers and pigments may be accomplished by dispersion or blending using a dispersing machine such as a dissolver, homogenizer, triple roll mill or the like. If necessary, filtration may also be performed using a mesh or membrane filter.

A photosensitive element according to the invention will now be explained.

Figure 1:
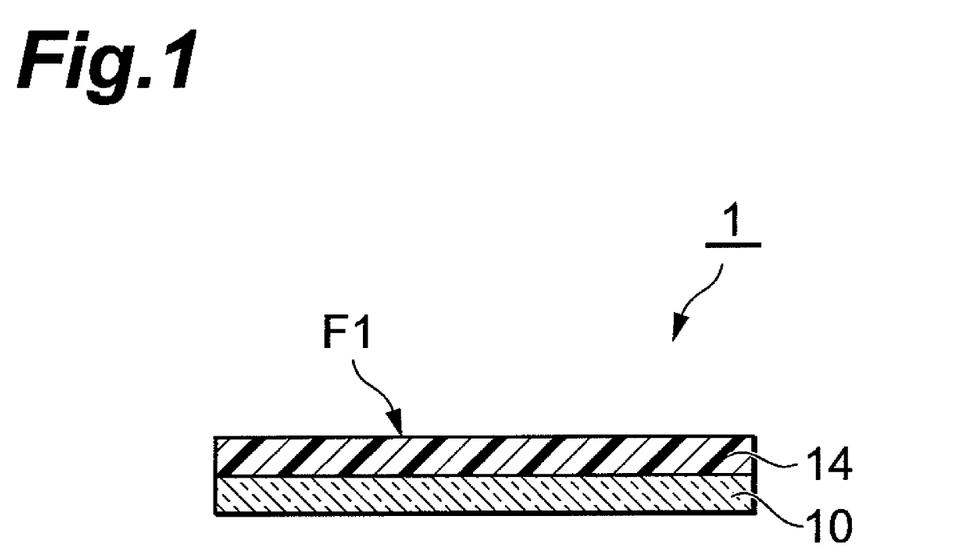
FIG. 1 is a schematic cross-sectional view showing a preferred embodiment of a photosensitive element of the invention.

FIG. 1 is a schematic cross-sectional view showing a preferred embodiment of a photosensitive element of the invention. The photosensitive element 1 shown in FIG. 1 has a structure with a photosensitive layer 14 laminated on a support 10. The photosensitive layer 14 is a layer composed of a photosensitive resin composition of the invention as described above.

The support 10 may be, for example, a metal plate such as copper, a copper-based alloy, iron, an iron-based alloy or the like, or a polymer film such as polyethylene terephthalate, polypropylene, polyethylene or polyester. The thickness of the support is preferably 1-100 μm.

The photosensitive layer 14 may be formed by coating the photosensitive resin composition of the invention as a liquid resist onto the support 10.

For coating of the photosensitive resin composition onto the support 10, if necessary it may be used as a coating solution prepared by dissolving the photosensitive resin composition into a prescribed solvent to a solid content of 30-60% by mass. As examples of such solvents there may be mentioned organic solvents such as methanol, ethanol, propanol, ethylene glycol, propylene glycol, octane, decane, petroleum ether, petroleum naphtha, hydrogenated petroleum naphtha, solvent naphtha, acetone, methyl isobutyl ketone, methyl ethyl ketone, cyclohexanone, toluene, xylene, tetramethylbenzene, N,N-dimethylformamide, ethyleneglycol monoethyl ether, ethyleneglycol monomethyl ether, ethyleneglycol monobutyl ether, diethyleneglycol monoethyl ether, diethyleneglycol monomethyl ether, diethyleneglycol monobutyl ether, diethyleneglycol dimethyl ether, propyleneglycol monomethyl ether, propyleneglycol monoethyl ether, dipropyleneglycol diethyl ether, triethyleneglycol monoethyl ether, ethyl acetate, butyl acetate, ethyleneglycol monoethyl ether acetate, ethyleneglycol monobutyl ether acetate, diethyleneglycol monoethyl ether acetate, diethyleneglycol monobutyl ether acetate, propyleneglycol monomethyl ether acetate and dipropyleneglycol monomethyl ether acetate, or mixtures of these solvents.

As examples of coating methods there may be mentioned methods employing a roll coater, comma coater, gravure coater, air knife coater, die coater, bar coater or the like. The solvent may be removed by, for example, heating the coating solution to volatilize off the solvent. The heating temperature in this case is preferably 70-150° C., and the heating time is preferably about 5-30 minutes.

The amount of residual organic solvent in the photosensitive layer 14 is preferably no greater than 2% by mass from the viewpoint of preventing diffusion of the organic solvent in subsequent steps.

The thickness of the photosensitive layer 14 will differ depending on the use, but the thickness after removal of the solvent is preferably about 0.5-100 μm.

The side F1 of the photosensitive layer 14 opposite the support side in the photosensitive element 1 may also be covered with a protective film (not shown).

As protective films there may be mentioned polymer films such as polyethylene and polypropylene. The protective film is preferably a low fisheye film. The adhesive force between the protective film and the photosensitive layer 14 is preferably less than the adhesive force between the photosensitive layer 14 and the support 10 in order to facilitate release of the protective film from the photosensitive layer 14.

The photosensitive element 1 may also comprise interlayers or protective layers such as a cushion layer, adhesive layer, photoabsorbing layer, gas barrier layer or the like between the support 10 and the photosensitive layer 14, and/or between the photosensitive layer 14 and the protective film.

The photosensitive element 1 may be stored as is in the form of a flat sheet, or it may be stored as a roll wound up on a winding core with a cylindrical or other shape after laminating a protective film on one side of the photosensitive layer (the unprotected, exposed side). The winding core is not particularly restricted so long as it is a conventional one, and as examples there may be mentioned plastics such as polyethylene resin, polypropylene resin, polystyrene resin, polyvinyl chloride resin, ABS resin (acrylonitrile-butadiene-styrene copolymer) and the like. Winding for storage is preferably done with the support on the outermost side. From the viewpoint of edge protection, an edge separator is preferably situated at the edge of the photosensitive element (photosensitive element roll) that has been wound up into a roll, and from the viewpoint of preventing edge fusion, the edge separator is preferably moisture-proof. For packaging of the photosensitive element 1, it is preferably bundled with a low moisture permeable black sheet.

A resist pattern forming method will now be explained.

In the resist pattern forming method of the invention, the aforementioned photosensitive element 1 is laminated onto a substrate with the photosensitive layer 14 bonded to the substrate, and the laminated body is irradiated with active light rays into an image form, after which the exposed sections are removed by development. The sections that have not been exposed to active light rays do not dissolve in alkaline aqueous solutions since the 1,2-quinonediazide compound interacts with the novolac-type phenol resin to function as a dissolution preventer. At the active light ray-exposed sections, however, the 1,2-quinonediazide compound is photodecomposed so that it loses its dissolution-preventing effect and allows the exposed sections to be soluble in the alkaline aqueous solution. Since the photosensitive resin composition of the invention has carboxyl groups as mentioned above, development can be carried out rapidly in weak alkaline aqueous solutions or dilute alkaline aqueous solutions.

The method of laminating the photosensitive layer 14 on the substrate may be one in which the protective film is removed, if the photosensitive element has a protective film, and the photosensitive layer 14 is contact bonded with the substrate at a pressure of about 0.1-1 MPa (1-10 kgf/cm$^x$2) while heating at about 70-130° C. This lamination step may also be carried out under reduced pressure. There are no particular restrictions on the surface of the substrate on which the photosensitive layer 14 is laminated.

The photosensitive layer 14 that has been laminated in this manner on the substrate is irradiated with active light rays into an image form through a negative or positive mask pattern to form exposed sections. When the support 10 on the photosensitive layer 14 is transparent to the active light rays, the active light rays can be irradiated through the support 10. When the support 10 is non-transparent to the active light rays, the photosensitive layer 14 is irradiated with the active light rays after removal of the support 10.

The light source for the active light rays may be a conventionally known light source such as, for example, a carbon arc lamp, mercury vapor arc lamp, high pressure mercury lamp, xenon lamp or the like, which efficiently emits ultraviolet rays or visible light. A laser direct writing exposure method may also be employed.

After forming the exposed sections, they are removed by development while leaving the photosensitive layer at sections other than the exposed sections (unexposed sections), to form a resist pattern. The method of removing the exposed sections may involve removing the support 10 with an autopeeler or the like if the support 10 remains on the photosensitive layer 14, and then removing the exposed sections by wet development using a developing solution which may be an aqueous alkali solution, aqueous developing solution, organic solvent or the like, or by dry development. As examples of alkalis to be used for wet development there may be mentioned weak alkaline inorganic compounds such as sodium carbonate, potassium carbonate and ammonia; alkali metal compounds such as sodium hydroxide and potassium hydroxide; alkaline earth metal compounds such as calcium hydroxide; weak alkaline organic compounds such as monomethylamine, dimethylamine, trimethylamine, monoethylamine, diethylamine, triethylamine, monopropylamine, dimethylpropylamine, monoethanolamine, diethanolamine, triethanolamine, ethylenediamine, diethylenetriamine, dimethylaminoethyl methacrylate and polyethyleneimine; and tetramethylammonium hydroxide, tetraethylammonium hydroxide and the like. These compounds may be used in aqueous solution either alone or in combinations of two or more. The pH of the aqueous alkali solution is preferably in the range of 9-11, and the temperature is adjusted as appropriate for the developing property of the photosensitive layer. The aqueous alkali solution may also contain added surfactants, defoaming agents, organic solvents and the like. The developing system may be, for example, a dip system, a spray system, or a brushing or slapping system.

Post-development treatment may consist of heating at about 60-250° C. for curing of the resist pattern.

This resist pattern forming method allows the exposed sections of the resist film to easily dissolve in weak alkaline aqueous solutions and be released from the substrate. It is thereby possible to obtain fine resist patterns with excellent contrast, using a photosensitive element 1 of the invention that has highly satisfactory weak alkali development properties.

EXAMPLES

The present invention will now be explained in greater detail based on examples and comparative examples, with the understanding that the invention is in no way limited to the examples.

[Synthesis of Novolac Resin A11]

After combining m-cresol (phenol compound) and p-cresol (phenol compound) in a mass ratio of 50:50, 54 parts by mass of formalin (aldehyde) was added to 216 parts by mass of the mixture. After further adding 2.2 parts by mass of oxalic acid (catalyst), condensation reaction was conducted by an ordinary procedure to obtain a novolac-type phenol resin with a weight-average molecular weight of 10,000. Next, 85 parts by mass of the novolac-type phenol resin, 23 parts by mass of tetrahydrophthalic anhydride (polybasic acid anhydride) and 0.9 part by mass of triethylamine (catalyst) were combined for reaction at 100° C. to obtain component (a) (acid value: 100 mgKOH/g). The resin was designated as novolac resin A11.

[Synthesis of Novolac Resin A12]

After combining m-cresol (phenol compound) and p-cresol (phenol compound) in a mass ratio of 50:50, 54 parts by mass of formalin (aldehyde) was added to 216 parts by mass of the mixture. After then adding 2.2 parts by mass of oxalic acid (catalyst), condensation reaction was conducted by an ordinary procedure to obtain a novolac-type phenol resin with a weight-average molecular weight of 10,000. Next, 85 parts by mass of the novolac-type phenol resin, 12 parts by mass of succinic anhydride (polybasic acid anhydride) and 0.9 part by mass of triethylamine (catalyst) were combined for reaction at 100° C. to obtain component (a) (acid value: 80 mgKOH/g). The resin was designated as novolac resin A12.

[Synthesis of Novolac Resin A13]

After combining m-cresol (phenol compound) and p-cresol (phenol compound) in a mass ratio of 40:60, 54 parts by mass of formalin (aldehyde) was added to 216 parts by mass of the mixture. After then adding 2.2 parts by mass of oxalic acid (catalyst), condensation reaction was conducted by an ordinary procedure to obtain a novolac-type phenol resin with a weight-average molecular weight of 10,000. Next, 85 parts by mass of the novolac-type phenol resin, 28 parts by mass of hexahydrophthalic anhydride (polybasic acid anhydride) and 0.9 part by mass of triethylamine (catalyst) were combined for reaction at 100° C. to obtain component (a) (acid value: 120 mgKOH/g). The resin was designated as novolac resin A113.

[Synthesis of Novolac Resin A21]

After combining m-cresol (phenol compound) and p-cresol (phenol compound) in a mass ratio of 50:50, 54 parts by mass of formalin (aldehyde) was added to 216 parts by mass of the mixture. After then adding 2.2 parts by mass of oxalic acid (catalyst), condensation reaction was conducted by an ordinary procedure to obtain a novolac-type phenol resin with a weight-average molecular weight of 10,000. The resin was designated as novolac resin A21.

Examples 1-3 and Comparative Examples 1, 2

Components (a) and (b) and the other components were combined in the compositional ratios listed in Table 1 (units:parts by mass) to obtain photosensitive resin compositions for Examples 1-3 and Comparative Examples 1 and 2. The compounds in Table 1 were as follows. The masses listed in Table 1 are nonvolatile component masses.

PCR-1150: Acid-modified phenol-novolac type epoxy acrylate oligomer (Nippon Kayaku Co., Ltd.), DNQ: 1,2-Quinonediazide compound obtained by reacting 3 mol of 1,2-naphthoquinone-2-diazide-5-sulfonyl chloride with 1 mol of compound represented by chemical formula (5) above, PGMEA: Propyleneglycol monomethylether acetate, MEK: Methyl ethyl ketone.

TABLE 1

|  |  | Example 1 | Example 2 | Example 3 | Comp. Ex. 1 | Comp. Ex. 2 |
|---|---|---|---|---|---|---|
| Component (a) | Novolac resin A11 | 80 | — | — | — | — |
|  | Novolac resin A12 | — | 85 | — | — | — |
|  | Novolac resin A13 | — | — | 75 | — | — |
|  | Novolac resin A21 | — | — | — | 75 | — |
|  | PCR-1150 | — | — | — | — | 85 |
| Component (b) | DNQ | 20 | 15 | 25 | 25 | 15 |
| Other components | PGMEA | 150 | 150 | 150 | 150 | 150 |
|  | MEK | 50 | 50 | 50 | 50 | 50 |

(Evaluation Method)

Solutions of the photosensitive resin compositions of Examples 1-3 and Comparative Examples 1 and 2 were used to fabricate photosensitive elements by the following procedure. First, the photosensitive resin composition solution was coated onto a polyethylene terephthalate film with a width of 380 mm and a thickness of 50 μm (hereinafter referred to as "PET film") and held in a hot air convection drier set to 100° C. to form a photosensitive layer. The heating was adjusted to produce a heated photosensitive layer film thickness of 3 μm. Each of the 35 μm-thick polyethylene films was placed over the formed photosensitive layer as a protective film and pressed with a roll to obtain photosensitive elements for Examples 1-3 and Comparative Examples 1 and 2 having their photosensitive layers covered with protective films.

The photosensitive layers of the photosensitive elements of Examples 1-3 and Comparative Examples 1 and 2 were also laminated onto glass plates while heating at 120° C., to obtain property evaluation samples for Examples 1-3 and Comparative Examples 1 and 2.

The property evaluation samples of Examples 1-3 and Comparative Examples 1 and 2 were used in the following manner to evaluate the unexposed section alkali resistance and the exposed section developing property.

[Evaluation of Unexposed Section Alkali Resistance]

The PET film was removed from the property evaluation sample and immersed in a 2.38% by mass tetramethylammonium hydroxide aqueous solution at room temperature for 60 seconds, after which the condition of the photosensitive layer was visually observed and evaluated on the following scale. Since the photosensitive layer was not exposed, the unexposed section was the entire sample. The results are shown in Table 2.

A: No abnormalities in resist film appearance.
B: Partial peeling of resist film.
C: Peeling of most of resist film.

[Evaluation of Exposed Section Developing Property]

The PET film was removed from the property evaluation sample and an exposure apparatus with a high-pressure mercury lamp (trade name: HMW-590 by Orc Manufacturing Co., Ltd.) was used for exposure at a dose of 100 mJ/cm². Following exposure, a 1% by mass aqueous sodium carbonate (weak alkali) was used for development at 30° C. for 60 seconds, and the amount of resist film remaining at the exposed section was visually evaluated on the following scale. The results are shown in Table 2.

A: Absolutely no resist film on glass surface (satisfactory developing property).
B: Some resist film remaining on glass surface.
C: Most of resist film remained on glass surface (poor developing property).

[Evaluation of Adhesiveness]

The PET film was removed from the property evaluation sample and the photosensitive layer was exposed with an exposure apparatus through a phototool. The phototool used had a wiring pattern with a 3/50-30/50 (units: μm) line/space pattern. An exposure apparatus with a high-pressure mercury lamp (trade name: HMW-590 by Orc Manufacturing Co., Ltd.) was used as an exposure apparatus at a dose of 100 mJ/cm². Following exposure, the photosensitive layer (resist film) was sprayed with 1% by mass aqueous sodium carbonate (30° C.) for development. The minimum line width (μm) of resist film remaining without release after development was measured to evaluate the adhesiveness. The results are shown in Table 2. In Table 2, the adhesiveness is represented as the minimum line width, with a smaller minimum line width indicating more excellent adhesiveness. The term "Not evaluated" in Table 2 means that the developing property was too poor to form a pattern.

TABLE 2

|  | Example 1 | Example 2 | Example 3 | Comp. Ex. 1 | Comp. Ex. 2 |
|---|---|---|---|---|---|
| Alkali resistance | A | A | A | A | C |
| Developing property | A | A | A | C | A |
| Adhesiveness | 10 | 7 | 10 | Not evaluated | >30 |

As seen by the results in Table 2, the photosensitive resin compositions of Examples 1-3 had highly satisfactory unexposed section alkali resistance and exposed section developing properties, as well as excellent adhesiveness, compared to the photosensitive resin compositions of Comparative Examples 1 and 2. It was thus confirmed that the invention can provide a photosensitive resin composition, a photosensitive element comprising it and a resist pattern forming method, whereby development can be accomplished satisfactorily even with weak alkaline aqueous solutions, and whereby sufficiently high photosensitivity, image contrast, resolution and adhesiveness are exhibited.

INDUSTRIAL APPLICABILITY

According to the invention, it is possible to produce a photosensitive resin composition and photosensitive element that develop sufficiently even with weak alkaline aqueous solutions, and that exhibit sufficiently high photosensitivity, image contrast, resolution and adhesiveness.

The invention claimed is:

1. A photosensitive resin composition comprising (a) a compound obtained by reacting a polybasic acid anhydride with the phenolic hydroxyl groups of a novolac-type phenol resin, and (b) a 1,2-quinonediazide compound, wherein component (a) is obtained by reacting the polybasic acid anhydride at 0.10-0.80 mol with respect to 1 mol of the phenolic hydroxyl groups in the novolac-type phenol resin, component (a) has in the molecule at least one divalent group represented by the following general formula (A):

[in formula (A), R represents a carboxylic anhydride residue], and component (b) is a compound obtained by reacting an organic compound having a hydroxyl and/or amino group with a 1,2-quinonediazide compound having a sulfo and/or sulfonyl chloride group, and the organic compound having a hydroxyl and/or amino group is a compound represented by any one of the following general formulas (1)-(3):

-continued (2)

(3)

[in formulas (1)-(3), $R^1$, $R^2$, $R^3$, $R^4$, $R^5$, $R^6$, $R^7$, $R^8$, $R^9$, $R^{10}$, $R^{11}$ and $R^{12}$ each independently represent hydrogen atom, substituted or unsubstituted C1-5 alkyl group or substituted or unsubstituted C1-5 alkoxy group, and X represents a single bond, oxygen atom or phenylene group].

2. A photosensitive resin composition according to claim 1, wherein the acid value of component (a) is 30-150 mgKOH/g.

3. A photosensitive resin composition according to claim 1, wherein the mixing proportion of component (a) is 50-95 parts by mass and the mixing proportion of component (b) is 5-50 parts by mass with respect to 100 parts by mass as the total of components (a) and (b).

4. A photosensitive element comprising a support and a photosensitive layer composed of a photosensitive resin composition according to claim 1 formed on the support.

5. A photosensitive resin composition according to claim 1, wherein the photosensitive resin composition is a positive photosensitive resin composition.

* * * * *